(12) United States Patent
Gluschenkov et al.

(10) Patent No.: US 7,615,435 B2
(45) Date of Patent: Nov. 10, 2009

(54) SEMICONDUCTOR DEVICE AND METHOD OF MANUFACTURE

(75) Inventors: Oleg Gluschenkov, Poughkeepsie, NY (US); Sameer Jain, Beacon, NY (US); Yaocheng Liu, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 11/830,867

(22) Filed: Jul. 31, 2007

(65) Prior Publication Data
US 2009/0032840 A1 Feb. 5, 2009

(51) Int. Cl.
H01L 21/8238 (2006.01)
(52) U.S. Cl. ............... 438/199; 438/154
(58) Field of Classification Search ......... 438/199, 438/154, 229
See application file for complete search history.

(56) References Cited

U.S. PATENT DOCUMENTS

| | | | |
|---|---|---|---|
| 6,483,171 B1 | 11/2002 | Forbes et al. | |
| 6,717,216 B1 | 4/2004 | Doris et al. | |
| 6,720,630 B2 | 4/2004 | Mandelman et al. | |
| 6,825,529 B2 | 11/2004 | Chidambarrao et al. | |
| 6,831,292 B2 | 12/2004 | Currie et al. | |
| 6,933,577 B2 | 8/2005 | Cabral, Jr. et al. | |
| 6,974,981 B2 | 12/2005 | Chidambarrao et al. | |
| 6,977,194 B2 | 12/2005 | Belyansky et al. | |
| 7,002,209 B2 | 2/2006 | Chen et al. | |
| 7,015,082 B2 | 3/2006 | Doris et al. | |
| 7,132,322 B1 | 11/2006 | Greene et al. | |
| 7,176,116 B2 | 2/2007 | Cabral, Jr. et al. | |
| 7,303,949 B2 * | 12/2007 | Chen et al. ............ | 438/199 |
| 2002/0063292 A1 | 5/2002 | Armstrong et al. | |
| 2002/0182822 A1 | 12/2002 | Mandelman et al. | |
| 2003/0032261 A1 | 2/2003 | Yeh et al. | |
| 2003/0040158 A1 | 2/2003 | Saitoh | |
| 2004/0238914 A1 | 12/2004 | Deshpande et al. | |
| 2004/0262784 A1 | 12/2004 | Doris et al. | |

(Continued)

FOREIGN PATENT DOCUMENTS

JP 64-76755 3/1989

OTHER PUBLICATIONS

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

(Continued)

*Primary Examiner*—Mark Prenty
(74) *Attorney, Agent, or Firm*—Joseph Abate; Greenblum & Bernstein P.L.C.

(57) ABSTRACT

A semiconductor device and method of manufacture and, more particularly, a semiconductor device having strain films and a method of manufacture. The device includes an embedded SiGeC layer in source and drain regions of an NFET device and an embedded SiGe layer in source and drain regions of a PFET device. The PFET device is subject to compressive strain. The method includes embedding SiGe in source and drain regions of an NFET device and implanting carbon in the embedded SiGe forming an SiGeC layer in the source and drain regions of the NFET device. The SiGeC is melt laser annealed to uniformly distribute the carbon in the SiGeC layer, thereby counteracting a strain generated by the embedded SiGe.

1 Claim, 5 Drawing Sheets

U.S. PATENT DOCUMENTS

| | | |
|---|---|---|
| 2005/0040460 A1 | 2/2005 | Chidambarrao et al. |
| 2005/0082634 A1 | 4/2005 | Doris et al. |
| 2005/0087824 A1 | 4/2005 | Cabral, Jr. et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148142 A1 | 7/2005 | Cabral, Jr. et al. |
| 2005/0148146 A1 | 7/2005 | Doris et al. |
| 2005/0189589 A1 | 9/2005 | Zhu et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0260808 A1 | 11/2005 | Chen et al. |
| 2005/0280051 A1 | 12/2005 | Chidambarrao et al. |
| 2005/0282325 A1 | 12/2005 | Belyansky et al. |
| 2006/0011984 A1 | 1/2006 | Currie |
| 2006/0014366 A1 | 1/2006 | Currie |
| 2006/0027868 A1 | 2/2006 | Doris et al. |
| 2006/0057787 A1 | 3/2006 | Doris et al. |
| 2006/0060925 A1 | 3/2006 | Doris et al. |
| 2006/0125008 A1 | 6/2006 | Chidambarrao et al. |

OTHER PUBLICATIONS

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded npn-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "$GE_x SI_{1-x}/Si$ Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. " Heterojuction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for $Si_{1-x} Ge_x$ Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

* cited by examiner

SEMICONDUCTOR DEVICE AND METHOD OF MANUFACTURE

BACKGROUND OF THE INVENTION

1. Field of the Invention

The invention relates to a semiconductor device and method of manufacture and, more particularly, to a semiconductor device having strain films and a method of manufacture.

2. Background Description

Metal-oxide semiconductor (MOS) transistors generally include a substrate made of a semiconductor material, such as silicon. The transistors also include a source region, a channel region and a drain region within the substrate. The channel region is located between the source and the drain regions. A gate stack, which includes a conductive material gate or gate conductor on top of a gate oxide layer and sidewall spacers, is provided above the channel region. More particularly, the gate oxide layer is provided on the substrate over the channel region, while the gate conductor is provided above the gate oxide layer. The sidewall spacers help define locations of source and drain ion implantation and form self-aligned silicide.

The amount of current flowing through a channel of a semiconductor device is proportional to the mobility of the carriers in the channel. Thus, the operation speed of the transistor can be increased by increasing the mobility of the carriers in the channel. To this end, mechanical stresses within a semiconductor device substrate can modulate device performance by, for example, increasing the mobility of the carriers in the semiconductor device. The mechanical strain can be induced by, for example, distinct processes and/or materials to create tensile or compressive strains in the NFETs and PFETs, respectively.

To maximize the performance of both NFETs and PFETs within integrated circuit (IC) chips, the strain components should be engineered and applied differently for the NFETs and PFETs. That is, because the type of strain which is beneficial for the performance of an NFET is generally disadvantageous for the performance of the PFET. More particularly, when a device is in tension (in the direction of current flow in a planar device), the performance characteristics of the NFET are enhanced; whereas, this same strain component would negatively affect the performance characteristics of the PFET.

In one processing example, e-SiGe (embedded silicon germanium) in source and drain regions can be used to induce a compressive strain in PFETs (e.g., as the compressive strain improves hole mobility). However, the growth of the e-SiGe requires the NFET to be covered with a nitride cap mask. This allows a trench to be etched in the PFET so that the SiGe can be grown within the source and drain regions of the PFET, while ensuring that the SiGe is not grown in the source and drain regions of the NFET.

The masking of the NFET is necessary during the SiGe growth process so as to ensure that the e-SiGe will not affect the device performance of the NFET (i.e., a compressive strain in the source and drain regions of the NFET will degrade electron mobility and thus degrade performance of the NFET.) Additionally, the nitride layer used to cover the NFET must be subsequently etched without etching the exposed SiGe in the PFET source and drain regions. Of course this creates additional fabrication steps, leading to increased manufacturing complexities and additional manufacturing costs. Moreover, utilizing the nitride layer to cover the NFET has implications in terms of the process window allowed for the thickness of the nitride layer and makes the overall process flow more complicated.

Accordingly, there exists a need in the art to overcome the deficiencies and limitations described hereinabove.

SUMMARY OF THE INVENTION

In a first aspect of the invention, a device comprises an embedded SiGeC layer in the source and drain regions of an NFET device. In embodiments, an embedded SiGe layer is provided in the source and drain regions of a PFET device. The PFET device is subject to compressive strain.

In a second aspect of the invention, a CMOS device comprises an embedded SiGeC in source and drain regions of an NFET and embedded SiGe in source and drain regions of a PFET. The PFET is placed under a compressive strain and the NFET is placed in one of a neutral state and a tensile strain.

In a third aspect of the invention, a method comprises embedding SiGe in source and drain regions of an NFET device and implanting carbon in the embedded SiGe forming an SiGeC layer in the source and drain regions of the NFET device. The method further includes annealing the SiGeC to uniformly distribute the carbon in the SiGeC layer, thereby counteracting a strain generated by the embedded SiGe.

DETAILED DESCRIPTION OF EMBODIMENTS OF THE INVENTION

The invention relates to a semiconductor device and method of manufacture and, more particularly, to a semiconductor device having strain films and a method of manufacture. In embodiments, the invention eliminates a masking step of an NMOS during epi SiGe growth in source and drain regions of the PFET. The processes of the invention also provide the desired strain in both PFET and NFET devices and, in embodiments, results in higher doping concentrations in the PFET device, leading to reduced contact resistance. In further embodiments, the invention achieves higher substitutional carbon concentrations (compared to known processes).

More particularly, the present invention provides a simple process flow for the fabrication of strained CMOS devices, as the invention eliminates the masking of the NMOS during epitaxial growth of the SiGe layer in the source and drain regions of the PMOS. Additionally, in embodiments, small amounts of carbon (C) may be used to compensate for a compressive stress caused by the SiGe in the source and drain regions of an NFET. A melt laser anneal, e.g., a laser spike anneal (LSA) process at temperatures as high as 1400° C. is used to melt and regrow both SiGe and SiGeC, without generating significant defects or degrading device performance. That is, according to the invention, using the laser spike anneal (LSA) processing to melt the SiGe layer and a SiGeC layer produces less end-of-range (EOR) damage. In this process, the carbon (of SiGeC) is uniformly distributed in the SiGe of the source and drain region of the NFET, which counteracts any compressive strains formed by the SiGe in the NFET.

Figure 1:
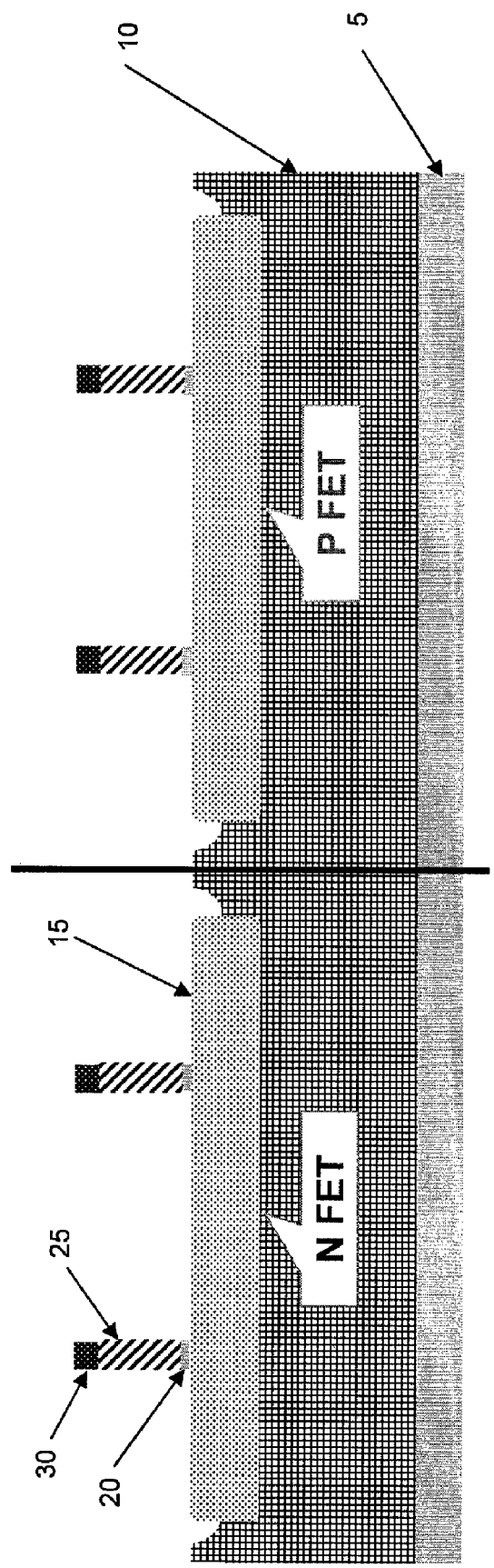
FIG. 1 shows a beginning structure in accordance with the invention.

FIG. 1 shows a beginning structure of an NFET and PFET in accordance with the invention. As shown in FIG. 1, a SOI (silicon on insulation) wafer is formed in a conventional manner. The SOI wafer includes a silicon (Si) layer 5, an oxide layer 10 above the Si layer 5, and a second Si layer 15 above the oxide layer 10. In embodiments, the Si layer 15 has a thickness of about 60-100 nm. Additionally, while the invention is described using an SOI wafer, it should be understood by one of ordinary skill in the art that a bulk Si substrate is also contemplated by the invention.

Referring still to FIG. 1, an optional gate oxide layer 20 is formed on the Si layer 15. The gate oxide layer 20 may be formed by any of the methods well known to those of skill in the art such as, for example, an oxidation followed with anneal and an etching. It should be understood by one of ordinary skill in the art that this step may be optional.

After the gate oxide layer 20 is formed, a layer of polysilicon is deposited to form a gate. Once the polysilicon has been deposited on the gate oxide layer 20, the polysilicon is patterned and etched to form polysilicon gates 25, for both the NFET and PFET devices. The polysilicon can be deposited and etched by any of the methods well known in the art for polysilicon deposition and etching such as, for example, CVD. Furthermore, nitride caps 30 may be formed atop the gates 25 in a conventional manner.

Figure 2:
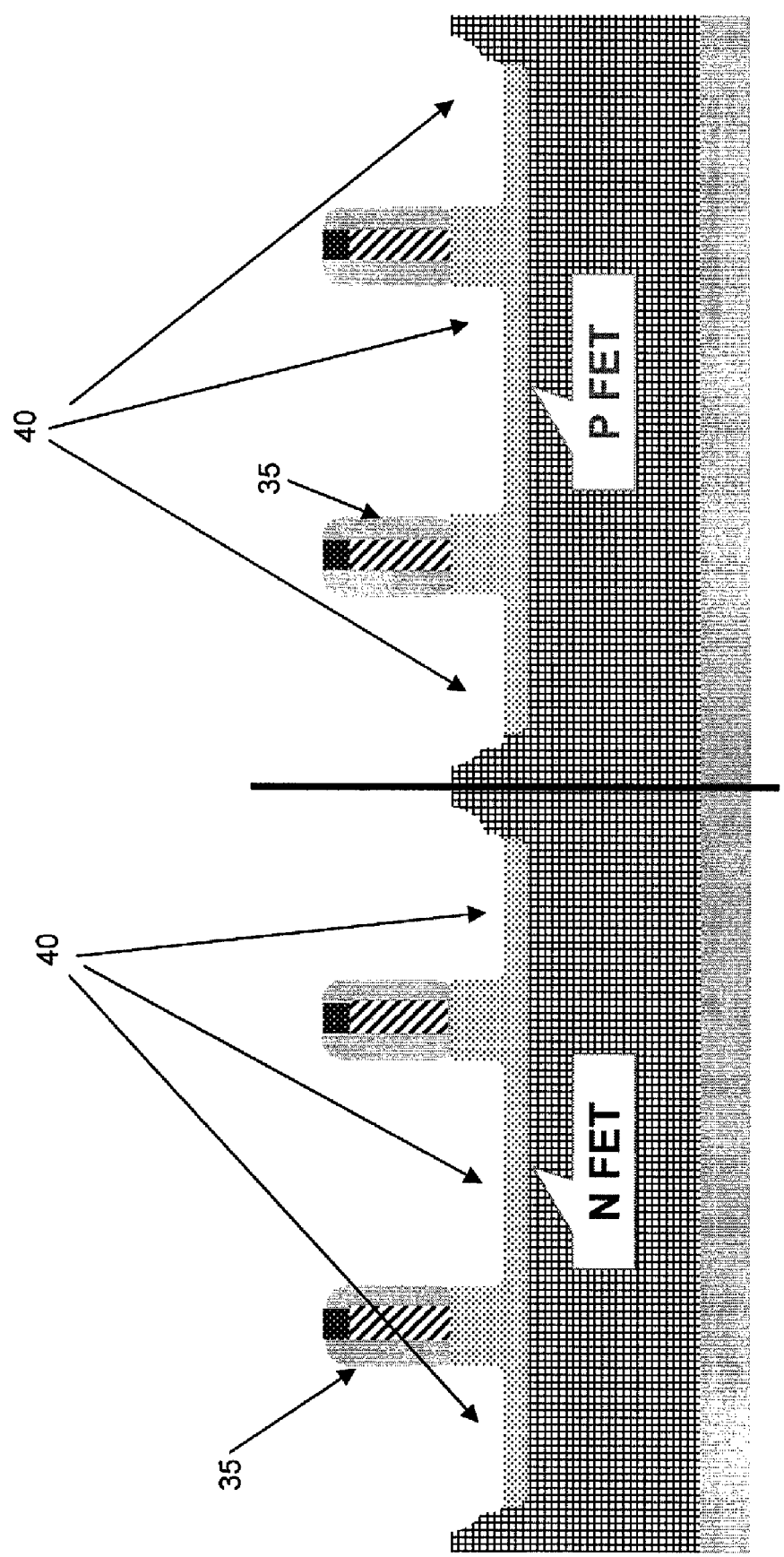
FIGS. 2-4 represent fabrication processes and accompanying structures in accordance with the invention.

FIG. 2 shows the structure after further processing steps, in accordance with the invention. Referring to FIG. 2, a layer of conformal nitride is deposited over the entire device to form nitride spacers 35 on the sidewalls of the gate 25. More particularly, after the nitride layer is deposited over the entire structure, an anisotropic etching process, e.g., reactive ion etching (RIE), is performed to form the nitride spacers 35, in addition to trenches 40. The nitride layer may have a thickness of about 50-200 Å, however, the thickness depends upon a desired distance of the trenches 40 from the channel of the devices. Moreover, in embodiments, the trenches 40 may be etched to a depth of about 40-70 nm. In this process flow, it is possible to eliminate the masking of the NFET and, as such, simplify the formation process.

Figure 3:
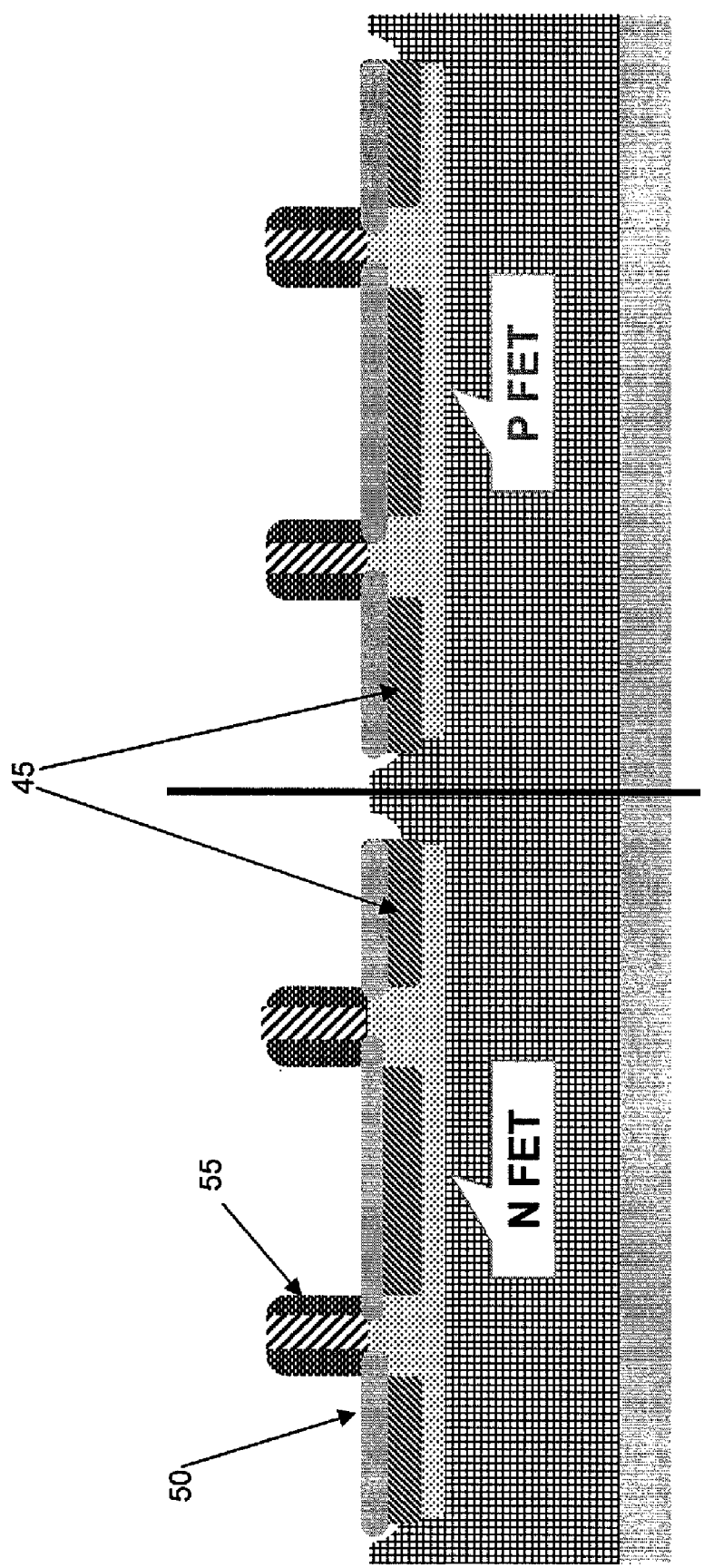

FIG. 3 shows the structure after further processing steps, in accordance with the invention. As shown in FIG. 3, SiGe 45 is epitaxially grown in the trenches 40 of both the NFET and the PFET devices. According to an aspect of the invention, the e-SiGe layer 45 may be about 30-80 nm thick. As such, the e-SiGe layer 45 may partially fill, completely fill or overfill the trenches 40. In embodiments, it is not necessary to etch or planarize the e-SiGe layer 45. Additionally, according to an aspect of the invention, the e-SiGe layer may have a Ge content between approximately 20%-35%; although, other concentrations are contemplated by the invention. As additionally shown in FIG. 3, a silicide layer 50 may be formed above the e-SiGe layer 45.

As further shown in FIG. 3, the nitride spacers 35 and nitride cap layer 30 may be etched and an oxide layer may be formed by a conformal oxide deposition followed by an anisotropic etch, e.g., RIE. As shown in FIG. 3, the conformal oxide deposition and etch forms the oxide spacers 55. Additionally, in embodiments, the oxide spacers 55 may have a thickness of about 3-12 nm. As should be understood by one of ordinary skill in the art, the oxide spacers 55 provide selectivity to the nitride spacers formed later in the process, and discussed below. This occurs, at least in part, because the dielectric constant is lowered in the oxide, which is desirable adjacent a gate, as this may introduce a fringe parasitic capacitance.

Figure 4:
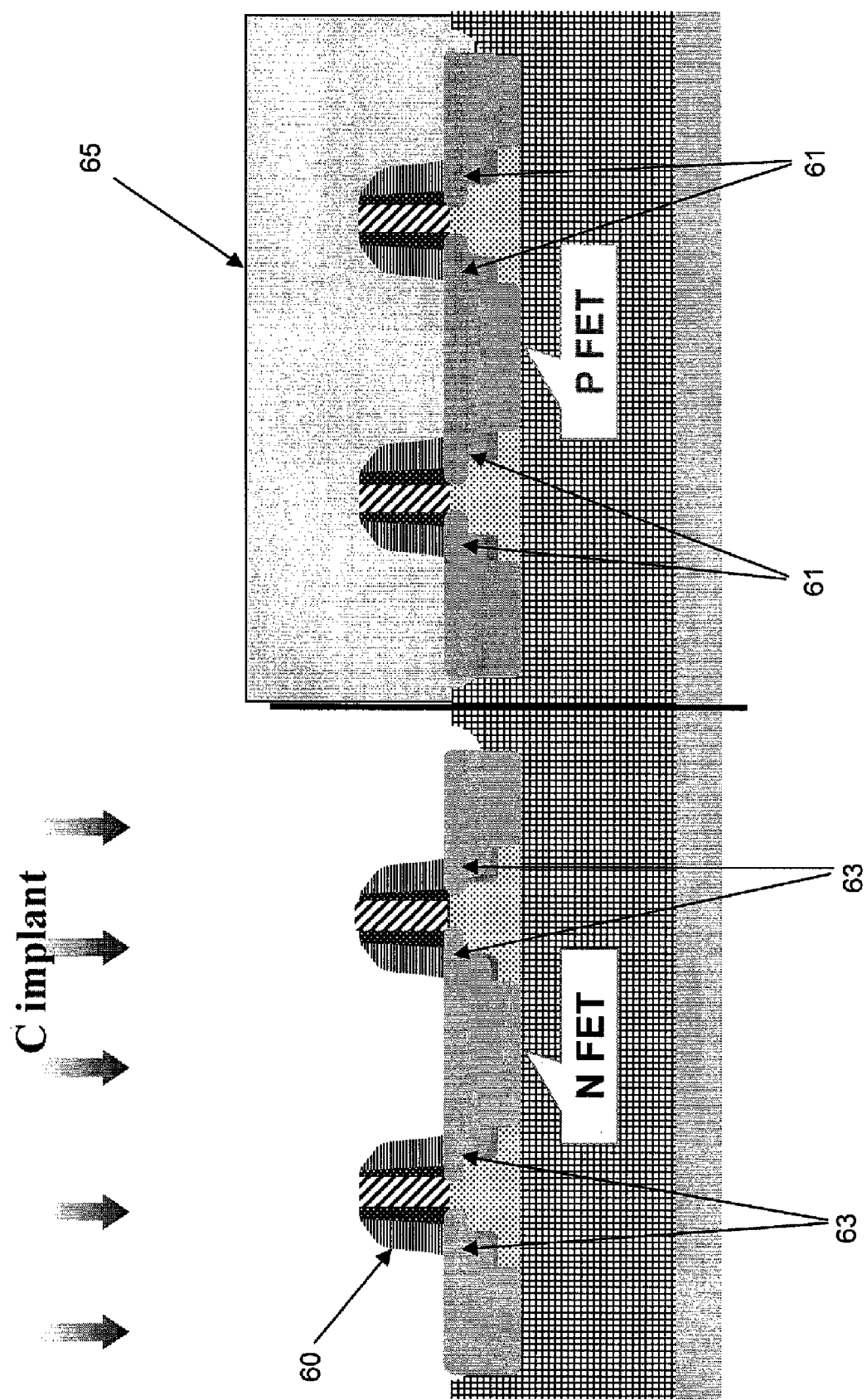

FIG. 4 shows the structure after further processing steps, in accordance with the invention. As shown in FIG. 4, nitride spacers 60 may be formed over the oxide spacers 55. According to the invention, the nitride spacers 60 may be formed by depositing nitride over the oxide spacers 55, and etching portions of the nitride layer to leave the nitride spacers 60. Additionally, in embodiments, the nitride spacers 60 may have a thickness of about 10-30 nm.

Additionally, referring to FIG. 4, the deep source and drain regions are formed in the NFET and the PFET devices. A mask used to form a resist (not shown) may be placed over the NFET so that the source and drain regions 61 of the PFET can be implanted with a p-type dopant, e.g., $BF_2$ at a high dose and high energy, e.g., 10 keV-30 keV. Additionally, a mask, e.g., a resist 65 may be formed over the PFET so that the source and drain regions 63 of the NFET may be implanted with an n-type dopant, e.g., As, at a high dose and high energy, e.g., 20 keV-35 keV.

FIG. 4 further shows an implantation of carbon (C) selectively into the source and drain regions 63 of the NFET forming SiGeC. More particularly, the carbon is implanted into the SiGe of the NFET. The carbon is used to counteract the compressive forces generated by the SiGe in the source and drain regions of the NFET. During the carbon implantation, the PFET is masked to block implantation of carbon into the source and drain regions of the PFET. In embodiments, the implantation of carbon may occur during the implantation of the source and drain regions of the NFET (while the PFET is already masked by resist 65). With this processing step, according to an aspect of the invention, the same resist 65 over the PFET may be used during implantation of the n-type dopant into the source and drain regions of the NFET and for the implantation of carbon into the e-SiGe layer of the NFET.

The energy level of the carbon implant may be about 6 keV-10 keV. However, this energy level may be higher or lower, depending upon the thickness of the SiGe layer. Furthermore, the energy level of the carbon implant may be less critical to the invention, as long as the carbon remains contained within the SiGe layer forming SiGeC, and does not dope lower layers of the substrate, e.g., the Si layer 15 or the oxide layer 10. Additionally, according to an aspect of the invention, the implant dosage may be between 1e15/cm3-1e16/cm3. The implantation of carbon may occur before or after a rapid thermal annealing (RTA), discussed further below.

After the implantation of the p-type dopants in the source and drain regions of the PMOS and the implantation of the n-type dopants in the source and drain regions of the NMOS, the device is subjected to a rapid thermal anneal (RTA). As discussed above, the carbon implant may occur before or after the RTA. According to the invention, the RTA occurs for about one second at 1000° C. Furthermore, as should be understood by one of ordinary skill in the art, if the carbon is implanted after the RTA step, a different resist may be used than that used to cover the PFET during the implantation of the n-type dopant in to the source and drain regions 63 of the NFET.

Figure 5:
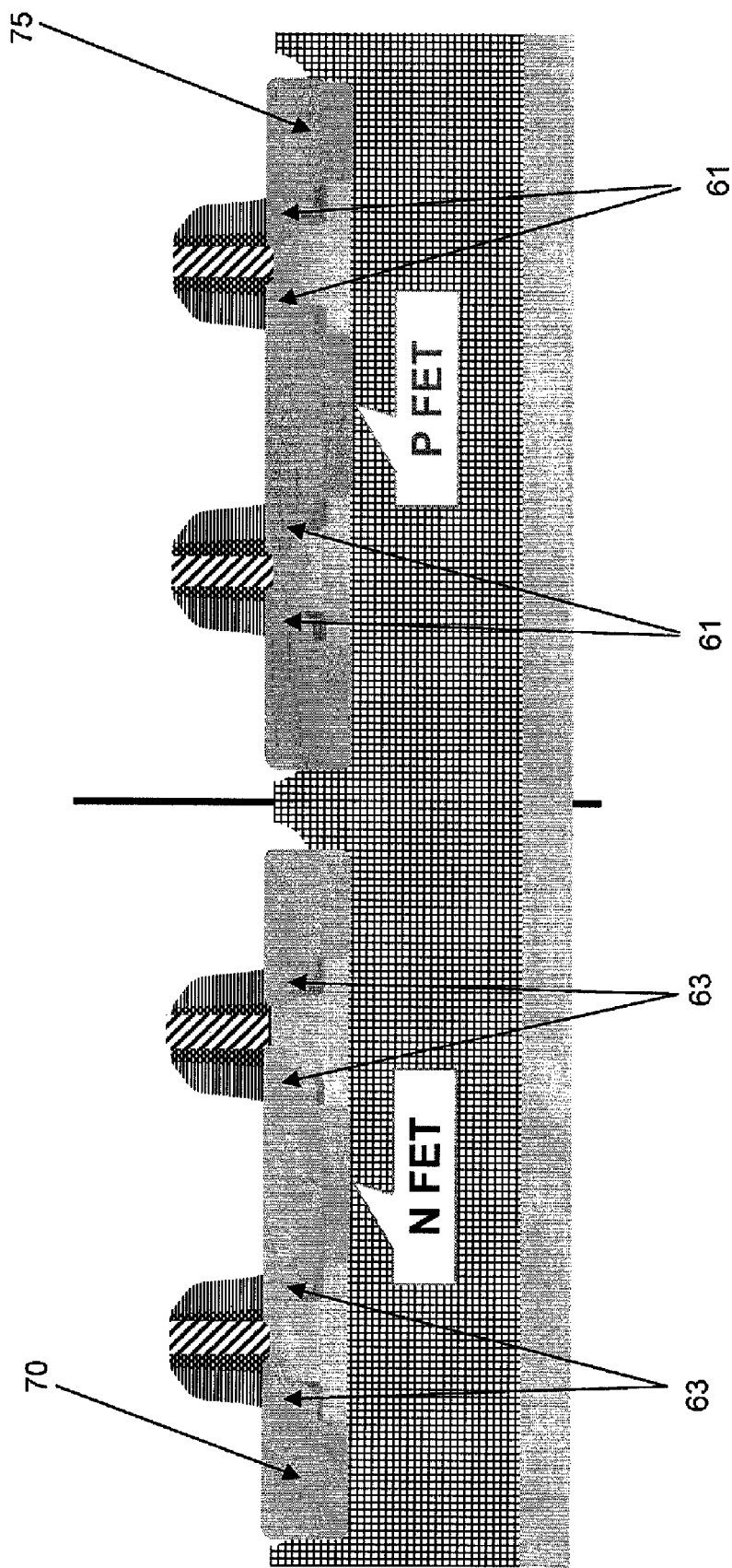
FIG. 5 shows additional processing steps and a final structure in accordance with the invention.

FIG. 5 shows the device after further processing steps, in accordance with the invention. In FIG. 5, after the implantation of carbon and the RTA, the device is subjected to a millisecond anneal, e.g., a laser spike anneal (LSA). In embodiments, the LSA is a very short duration anneal, e.g., about a millisecond, at about 1300° C. to 1400° C. The LSA melts the SiGe layer 75 and SiGeC layer 70; however, the LSA is not hot enough to melt the Si layer 15, which has a melting point of around 1410° C. In this way, the LSA will not destroy the device.

In embodiments, the LSA is of high enough temperature to melt and regrow the SiGe layer 75 in the source and drain regions 61 of the PFET and the SiGeC layer 70 in the source and drain regions 63 of the NFET. As should be understood, the carbon does not significantly affect the melting point of the ternary alloy (SiGeC). As the SiGeC recrystalizes, the process uniformly redistributes the C in the SiGeC layer 70 in the source and drain regions 63 of the NFET, resulting in the NFET being in a neutral (e.g., neither in compression or tension) or tensile strain (depending on the C dose implanted).

According to the invention, after the LSA and the recrystalization of the SiGe layer 75 of the PFET, the PFET will remain subject to a compressive strain due to the SiGe layer 75 in the source and drain regions 61 of the PFET. This compressive strain in the source and drain regions of the PFET is desirable, as the compressive strain increases hole mobility and thus increases PFET performance.

Additionally, according to the invention, the SiGeC layer 70 in the source and drain regions 63 of the NFET will not be under a compressive strain. Rather, according to the invention, the implantation of C in the SiGe layer of the NFET and the LSA of the SiGeC layer 70, will counteract the compressive strain that would be caused by the SiGe layer alone. Moreover, according to the invention, increasing the C content further not only compensates for the compression induced by the SiGe, but also can induce a tensile strain in the source and drain regions 63 of the NFET. The tensile strain in the source and drain regions 63 of the NFET will increase the NFET performance by enhancing electron mobility.

While the invention has been described in terms of exemplary embodiments, those skilled in the art will recognize that the invention can be practiced with modifications and in the spirit and scope of the appended claims.

What is claimed is:

1. A method, comprising:
   embedding SiGe in source and drain regions of an NFET device;
   implanting carbon in the embedded SiGe forming an SiGeC layer in the source and drain regions of the NFET device; and
   heating the SiGeC to uniformly distribute the carbon in the SiGeC layer, thereby counteracting a strain generated by the embedded SiGe, wherein:
   the heating is a melt laser anneal;
   the heating is below a melting point of an underlying substrate; and
   the carbon is implanted before or after a rapid thermal anneal of the source and drain regions of the NFET device;
   the method further comprising:
   embedding SiGe in source and drain regions of a PFET device and blocking the source and drain regions of the PFET device during the implanting step; and
   masking the PFET device with a same mask during the implanting step and implantation of the source and drain regions of the NFET device,
   wherein the embedding SiGe in the source and drain regions of the NFET device is performed at a same time as the embedding SiGe in the source and drain regions of the PFET device.

* * * * *